(12) United States Patent

Tavakoli et al.

(10) Patent No.: US 12,603,259 B2

(45) Date of Patent: Apr. 14, 2026

(54) RESISTIVITY-CONTROLLED DIELECTRIC MATERIALS FOR SUBSTRATE SUPPORTS WITH IMPROVED HIGH TEMPERATURE CHUCKING

(71) Applicant: Applied Materials, Inc., Santa Clara, CA (US)

(72) Inventors: Amir H. Tavakoli, San Jose, CA (US); Jian Li, Fremont, CA (US); Peter Reimer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 171 days.

(21) Appl. No.: 18/334,038

(22) Filed: Jun. 13, 2023

(65) Prior Publication Data

US 2024/0420933 A1     Dec. 19, 2024

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/2001* (2013.01); *H01J 2237/2007* (2013.01); *H01J 2237/332* (2013.01)

(58) Field of Classification Search
CPC ......... H01J 37/32724; H01J 2237/2001; H01J 2237/2007; H01J 2237/332; H01L 21/6833; H01L 21/67103; H01L 21/6831; H01L 21/68757

USPC .......................................................... 361/234
See application file for complete search history.

(56) References Cited

U.S. PATENT DOCUMENTS

| | | | | |
|---|---|---|---|---|
| 11,133,212 B2 * | 9/2021 | Khaja | ................. | H01L 21/6833 |
| 11,282,734 B2 * | 3/2022 | Kuno | ....................... | B23Q 3/15 |
| 11,396,704 B2 * | 7/2022 | Fujisato | ............ | C23C 16/45536 |
| 11,501,993 B2 * | 11/2022 | Li | ....................... | H01L 21/6833 |
| 2016/0049323 A1 * | 2/2016 | Ye | ....................... | H01L 21/6833 |
| | | | | 361/234 |
| 2018/0005860 A1 * | 1/2018 | Miyamoto | ............. | H02N 13/00 |
| 2023/0029265 A1 * | 1/2023 | Chen | ................. | H01J 37/32935 |

FOREIGN PATENT DOCUMENTS

| | | | | | |
|---|---|---|---|---|---|
| WO | WO-2016025573 A1 * | 2/2016 | ........ | H01L 21/6833 |
| WO | WO-2025034495 A1 * | 2/2025 | ........ | H01J 37/32724 |

* cited by examiner

*Primary Examiner* — Dharti H Patel

(74) *Attorney, Agent, or Firm* — Kilpatrick Townsend & Stockton LLP

(57) ABSTRACT

Substrate support assembly and methods of making such substrate support assemblies are provided. Substrate support assemblies include an electrostatic chuck body defining a substrate support surface, a support stem coupled with the electrostatic chuck body, and an electrode embedded within the electrostatic chuck body. Substrate support surfaces exhibit a resistivity of $1 \times 10^8$ Ω-cm to $1 \times 10^{11}$ Ω-cm at a temperature of greater than 650° C. Substrate support surfaces can include a composite ceramic material having a base dielectric material and a second dielectric material having an electrical resistivity at least about two times higher than an electrical resistivity of the base dielectric material at a temperature of greater than 650° C.

8 Claims, 4 Drawing Sheets

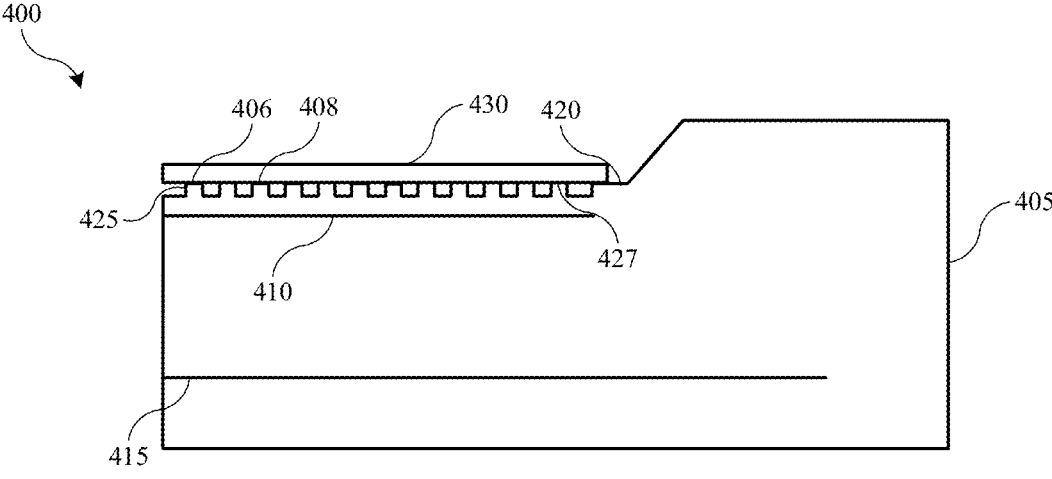

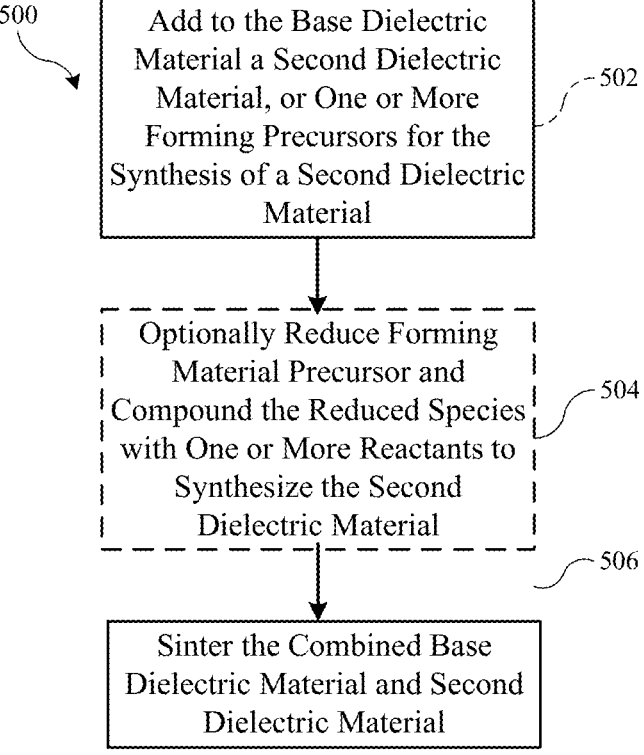

500

Add to the Base Dielectric Material a Second Dielectric Material, or One or More Forming Precursors for the Synthesis of a Second Dielectric Material

502

Optionally Reduce Forming Material Precursor and Compound the Reduced Species with One or More Reactants to Synthesize the Second Dielectric Material

504

506

Sinter the Combined Base Dielectric Material and Second Dielectric Material

*FIG. 5*

RESISTIVITY-CONTROLLED DIELECTRIC MATERIALS FOR SUBSTRATE SUPPORTS WITH IMPROVED HIGH TEMPERATURE CHUCKING

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. In addition, substrate supports can function electrically for clamping of the substrate. The substrate support may also be utilized in some technologies to develop a substrate-level plasma. Plasma generated near the substrate may cause bombardment of components, as well as parasitic plasma formation in unfavorable regions of the chamber. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

BRIEF SUMMARY

The present technology is generally directed to substrate support assemblies and methods of forming such assemblies having improved resistivities. Substrate support assemblies include an electrostatic chuck body defining a substrate support surface, a support step coupled with the electrostatic chuck body, and an electrode embedded within the electrostatic chuck body. Substrate support assemblies include where the substrate support surface exhibits a resistivity of $1 \times 10^8$ $\Omega$-cm to $1 \times 10^{11}$ $\Omega$-cm at a temperature of greater than 600° C.

In embodiments, substrate support assemblies include where the substrate support surface has a resistivity of $1 \times 10^8$ $\Omega$-cm to $1 \times 10^{11}$ $\Omega$-cm at a temperature of greater than 650° C. In more embodiments, substrate support assemblies further include a heater embedded in the chuck body.

The present technology may also be generally directed to substrate support assemblies that include an electrostatic chuck body defining a substrate support surface, a support stem coupled with the electrostatic chuck body, and an electrode embedded within the electrostatic chuck body. Substrate support assemblies include where the substrate support surface includes a composite ceramic material that contains a base dielectric material and a second dielectric material having an electrical resistivity at least about two times higher than an electrical resistivity of the base dielectric material at a temperature of greater than 600° C.

In embodiments, the composite ceramic material has a second dielectric material concentration at any given point along the substrate support or portion thereof that is greater than or about 50% of an average second dielectric material concentration. In further embodiments, the base dielectric material includes aluminum nitride, the second dielectric material includes boron nitride, or both the base dielectric material includes aluminum nitride, and the second dielectric material includes boron nitride. In yet more embodiments, the second dielectric material is present in the composite ceramic material in an amount of about 0.1 wt. % to about 30 wt. % based upon the weight of the base dielectric material and the second dielectric material. Additionally or alternatively, embodiments include where the boron nitride is polycrystalline boron nitride, pyrolytic boron nitride, amorphous boron nitride, stack of multiple sheets of boron nitride, or a combination thereof.

The present technology is also generally directed a method of forming all or a portion of a substrate support. Methods include combining a base dielectric material with a second dielectric material, or with one or more second dielectric material forming precursors, forming a powder mixture. Methods include optionally reducing the one or more second dielectric material forming precursors followed by subsequent compound. Methods include forming a composite material, where the composite ceramic material has a second dielectric material concentration at any given point or region along the substrate support or portion thereof that is greater than or about 50% of an average second dielectric material concentration.

In embodiments, methods include where the base dielectric material is combined with one or more second dielectric material forming precursors, the one or more second dielectric material forming precursors including a boron containing precursor. In more embodiments, the one or more second dielectric material forming precursors further includes a nitrogen containing precursor. Furthermore, in embodiments, methods include a carbon precursor combined with the one or more second dielectric material forming precursors and the base dielectric material. In yet another embodiment, methods include reducing and compounding the one or more second dielectric material forming precursors, where the reducing and/or compounding includes thermally treating the powder mixture at a temperature of about 600° C. to about 1700° C. Moreover, in embodiments, methods include where the reducing and compounding includes one or more reducing gasses, one or more forming gasses, one or more inert gasses or a combination thereof. In embodiments, the one or more forming gasses includes a nitrogen containing forming gas. In yet more embodiments, methods include where the dielectric material is combined with the second dielectric material by deposition of one or more layers of the second dielectric material on particles of the base dielectric material. Additionally or alternatively, in embodiments, deposition methods include chemical vapor deposition, atomic layer deposition, or a combination thereof. In yet another embodiment, the second dielectric material includes pyrolytic boron nitride. In more embodiments, methods include where the base dielectric material is combined with sheets or particles of the second dielectric material. In more embodiments, sheets or particles of the second dielectric material are exfoliated from particles of the second dielectric material.

Such technology may provide numerous benefits over conventional systems and techniques. For example, embodiments of the present technology may provide substrate supports that may both facilitate tailored resistivity and may remain stable during high-temperature operations. Additionally, by providing electrostatic chuck materials with consistent, tunable, resistivity at high temperatures, an increased chucking temperature window may be afforded. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 4 shows a schematic partial cross-sectional view of an exemplary substrate support assembly according to some embodiments of the present technology.

FIG. 5 shows operations in a method according to embodiments of the present technology.

Figure 1:
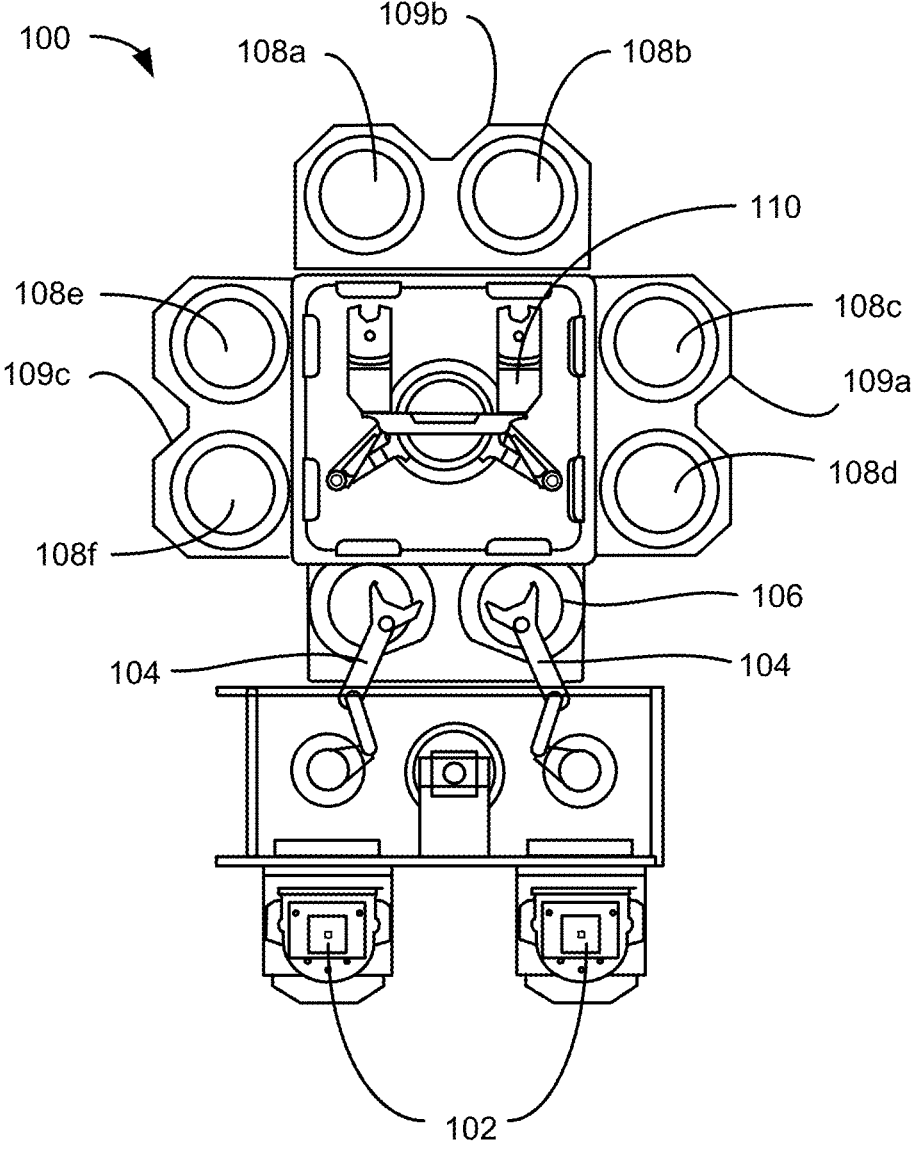
FIG. 1 shows a top plan view of an exemplary processing system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deposition processes, such as thermal deposition and plasma enhanced deposition processes may energize one or more constituent precursors to facilitate film formation on a substrate. These formed films may be produced under conditions that cause stresses on the substrate. For example, in the development of dielectric layers for vertical memory applications, such as ON stacks, many layers of material may be deposited on a substrate. These produced films may be characterized by internal stresses that act upon the substrate. This may cause a substrate to bow during processing, which can lead to poor uniformity of formation, as well as device damage or malfunction.

An electrostatic chuck may be used to produce a clamping action against substrates to overcome the bowing stress during deposition processes. However, as these device stacks increase in numbers of layers, the stresses acted upon the substrate increase, which may require a proportional increase in chucking voltage. Additionally, many of these films may be developed at relatively high temperatures that further affect components of the chamber. For example, it is desired to conduct deposition activities at temperatures above 600° C. or higher, which affects the resistivity of chamber components, such as the dielectric materials of the electrostatic chuck. As the resistivity of the dielectric material reduces, current leakage may increase. When compounded with the increased voltages used to overcome the bowing stresses exerted on the substrate with increased deposition layers, electric arcs may be produced, which can damage substrates and chamber components. These issues have limited conventional technologies to narrow chucking windows that cannot accommodate increased scaling of layers during deposition and/or deposition at high temperatures (e.g., 650° C.-700° C. or greater), as current chucks are formed from materials that exhibit resistivities below $10^8$ $\Omega$-cm at temperatures above 650° C.-700° C.

The present technology overcomes these and other challenges by forming substrate support assemblies having particular materials and configurations that exhibit resistivities of greater than $10^8$ $\Omega$-cm, even at temperatures of greater than 650° C.-700° C. The present technology has surprisingly found that by including a second dielectric material having a resistivity that is at least about twice a resistivity of the base dielectric material (e.g., aluminum nitride in embodiments), in tailored amounts, specific chucking voltages can be achieved at high temperatures. Moreover, in embodiments, the second dielectric material may be mixed with the base dielectric so as to preventing clumping and agglomeration, resulting in a composite ceramic material that has the second dielectric material relatively evenly dispersed within the base dielectric material, further improving the resistivity and control thereof. For instance, without wishing to be bound by theory, it is believed that the second dielectric material creates a non-linear electrical conduction path in addition to increased resistivity for electrical charge transfer. Namely, when the resistivity of the second dielectric is significantly greater than the base dielectric, the charge would prefer to "go around" the higher-resistivity areas, remaining within the base dielectric material, altering the electrical conduction path. However, the second dielectric material may also influence the resistivity in areas of the base dielectric material bordering the second dielectric material, increasing the resistivity of the electrical charge transfer in these reasons. Thus, high-quality composite ceramic materials may be provided, such as composite ceramic materials suitable for chucking devices, and, in embodiments, composite ceramic materials well-suited for high-temperature applications. Moreover, although the composite ceramic materials have so far been discussed for high-temperature applications, the electrical resistivity of such composite ceramic materials may also be tailored for use at temperatures less than 650° C.

Although the remaining disclosure will routinely identify specific deposition processes utilizing the disclosed technology, it will be readily understood that the systems and devices are equally applicable to other deposition and cleaning chambers, such as other chambers that may benefit from improved electrostatic chucking, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
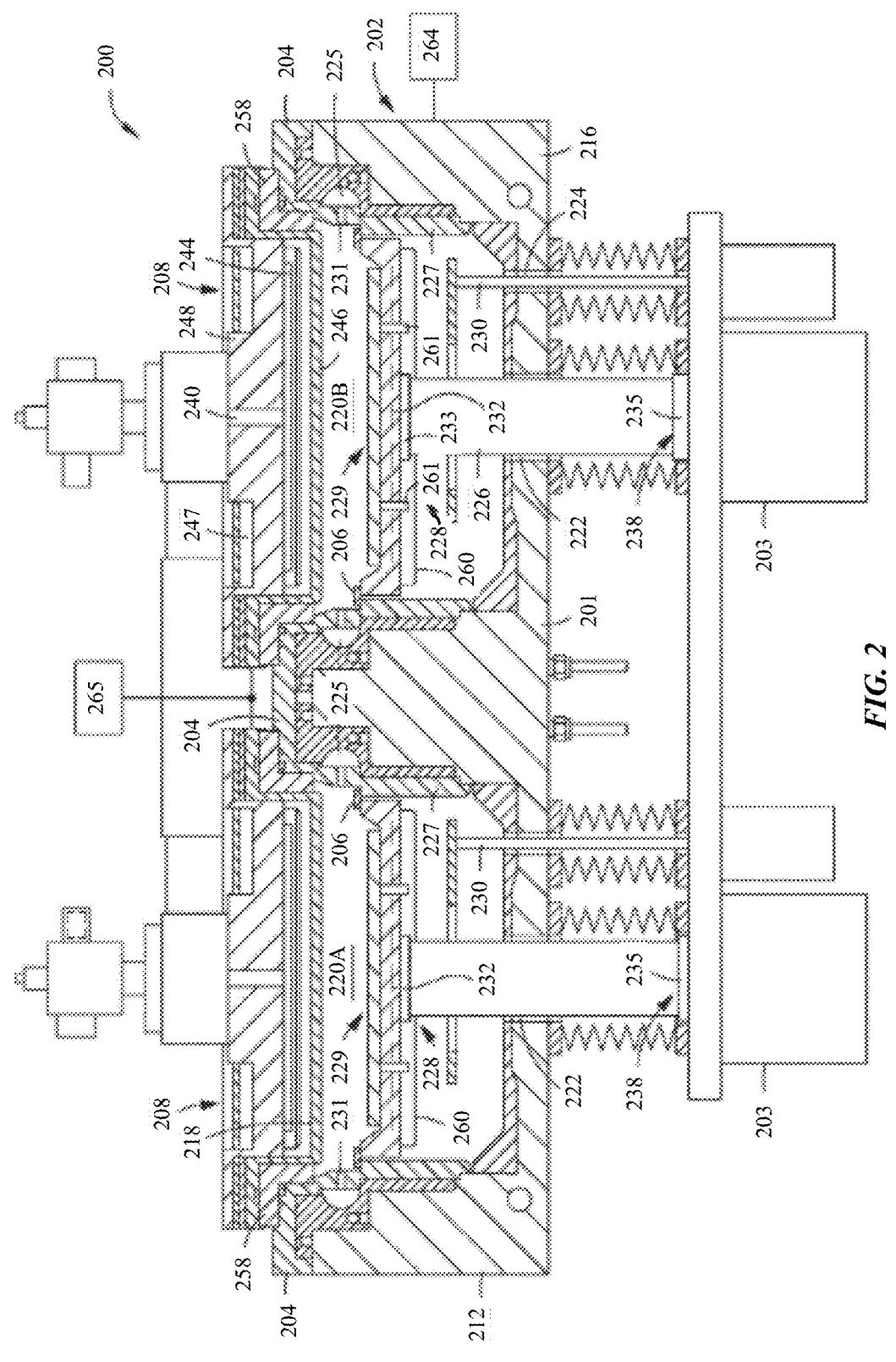
FIG. 2 shows a schematic cross-sectional view of an exemplary plasma enhanced substrate processing system according to some embodiments of the present technology.

FIG. 2 shows a schematic cross-sectional view of an exemplary plasma enhanced processing system 200 according to some embodiments of the present technology. The plasma enhanced processing system 200 may illustrate a pair of processing chambers 108 that may be fitted in one or more of tandem sections 109 described above, and which may include substrate support assemblies according to embodiments of the present technology. The plasma enhanced processing system 200 generally may include a chamber body 202 having sidewalls 212, a bottom wall 216, and an interior sidewall 201 defining a pair of processing regions 220A and 220B. Each of the processing regions 220A-220B may be similarly configured and may include identical components.

For example, processing region 220B, the components of which may also be included in processing region 220A, may include a pedestal 228 disposed in the processing region through a passage 222 formed in the bottom wall 216 in the plasma enhanced processing system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
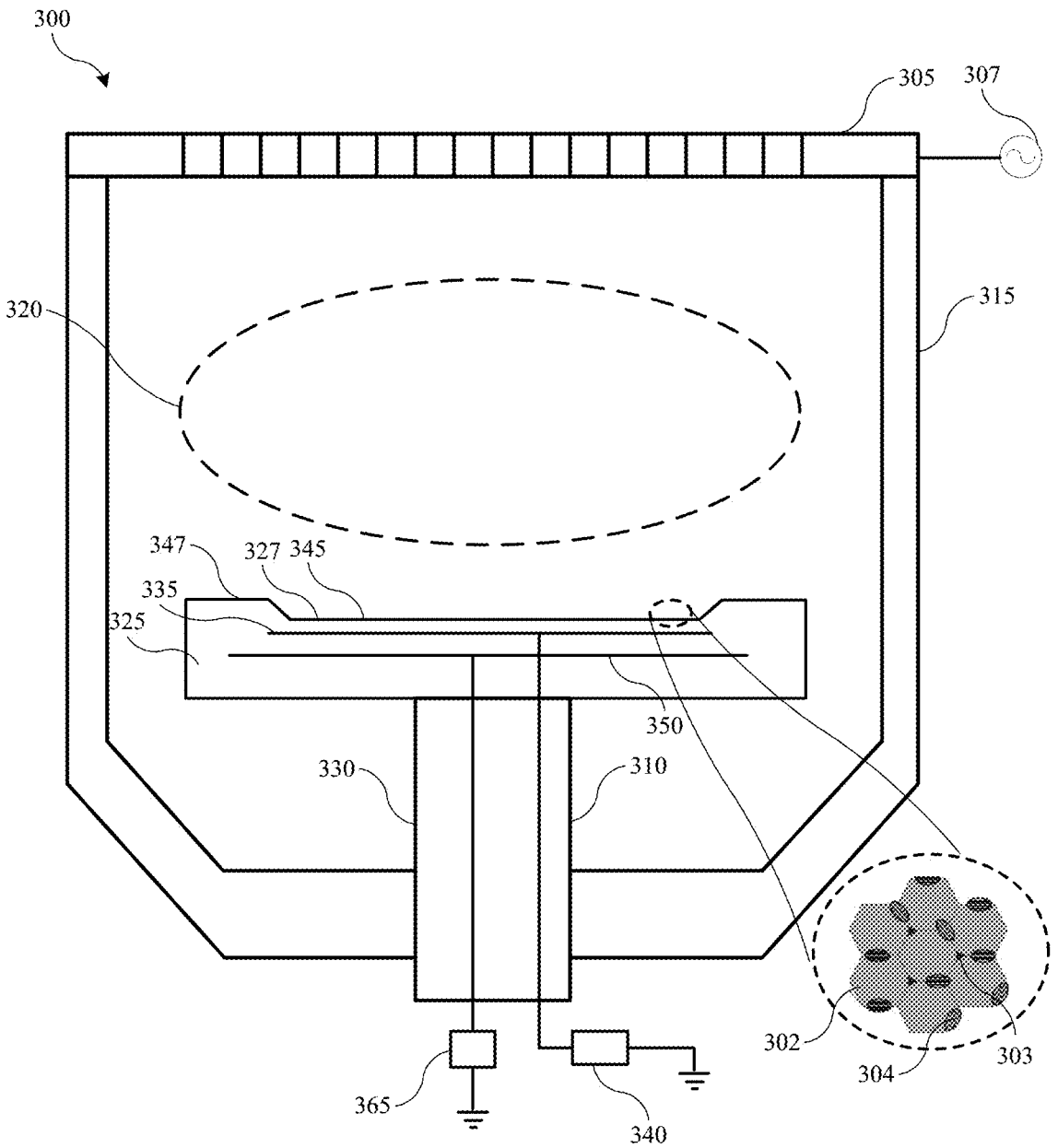
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels as will be discussed below for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include an electrode 335, which may be a DC electrode, embedded within the chuck body proximate the substrate support surface. Electrode 335 may be electrically coupled with a power source 340. Power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, electrode 335 may also be a chucking mesh that operates as electrical ground for a capacitive plasma system including an RF source 307 electrically coupled with showerhead 305. For example, electrode 335 may operate as a ground path for RF power from the RF source 307, while also operating as an electric bias to the substrate to provide electrostatic clamping of the substrate to the substrate support surface. Power source 340 may include a filter, a power supply, and a number of other electrical components configured to provide a chucking voltage.

In operation, a substrate may be in at least partial contact with the substrate support surface of the electrostatic chuck body, which may produce a contact gap, which may essentially produce a capacitive effect between a surface of the pedestal and the substrate. Voltage may be applied to the contact gap, which may generate an electrostatic force for chucking. The power supply 340 may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a ceramic material of the chuck body based on a finite resistance within the dielectric for Johnsen-Rahbek type chucking, which will be discussed in greater detail below.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

As discussed above, in embodiments the electrostatic chuck body 325, the stem 330, and/or the support surface 327 may be formed from insulative or ceramic materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different ceramic material composites may be used to provide composites configured to operate at particular temperature ranges.

Namely, as discussed above, in embodiments, the ceramic material may be a composite ceramic material formed from a base dielectric material having a first electrical resistivity and a second dielectric material having a second electrical resistivity higher than the first electrical resistivity. In embodiments, the base dielectric material may be present in the composite in an amount of greater than or about 70 wt. %, such as greater than or about 75 wt. %, such as greater than or about 77.5 wt. %, such as greater than or about 80 wt. %, such as greater than or about 82.5 wt. %, such as greater than or about 85 wt. %, such as greater than or about 87.5 wt. %, such as greater than or about 90 wt. %, such as greater than or about 92.5 wt. %, such as greater than or about 95 wt. %, such as greater than or about 96 wt. %, such as greater than or about 97 wt. %, such as greater than or about 98 wt. %, such as greater than or about 99 wt. %, such as greater than or about 99.5 wt. %, such as greater than or about 99.8 wt. %, or any ranges or values therebetween, based upon the weight of the base dielectric material and second dielectric material in the composite ceramic material.

In addition, the second dielectric material may be present in the composite in an amount of less than or about 30 wt. %, such as less than or about 27.5 wt. %, such as less than or about 25 wt. %, such as less than or about 22.5 wt. %, such as less than or about 20 wt. %, such as less than or about 17.5 wt. %, such as less than or about 15 wt. %, such as less than or about 12.5 wt. %, such as less than or about 10 wt. %, such as less than or about 7.5 wt. %, such as less than or about 5 wt. %, such as less than or about 4 wt. %, such as less than or about 3 wt. %, such as less than or about 2 wt. %, such as less than or about 1 wt. %, such as less than or about 0.5 wt. %, such as less than or about 0.2 wt. %, such as less than or about 0.1 wt. %, or any ranges or values therebetween, based upon the weight of the base dielectric material and second dielectric material in the composite ceramic material. Namely, in embodiments, it may be desirable to impart a tailored resistivity to the composite ceramic material. Thus, when higher resistivity is desired (e.g., as an example only, when utilizing very high processing temperatures) it may be desirable to utilize higher amounts of the second dielectric material, such as greater than about 1 wt. %. Nonetheless, it should be clear that the amount and resistivity of the second dielectric material may be selected to impart a tailored resistivity to the composite ceramic material.

For instance, in embodiments, the second dielectric material may have an electrical resistivity at the desired temperature (e.g., any one or more of the temperatures or ranges thereof discussed herein) that is greater than or about 0.1 orders of magnitude than the electrical resistivity of the base dielectric material at the temperature, such as greater than or about 0.5 order of magnitude, such as greater than or about 1 order of magnitude, such as greater than or about 1.5 orders of magnitude, such as greater than or about 2 orders of magnitude, such as greater than or about 2.5 orders of magnitude, such as greater than or about 3 orders of magnitude, such as greater than or about 3.5 orders of magnitude, such as greater than or about 4 orders of magnitude, such as greater than or about 4.5 orders of magnitude, such as greater than or about 5 orders of magnitude, such as greater than or about 5.5 orders of magnitude, such as greater than or about 6 orders of magnitude than the electrical resistivity of the base dielectric material at the selected temperature, or any ranges or values therebetween.

In embodiments, as an example only, the base dielectric material may be one or more of aluminum oxide, beryllium oxide, aluminum nitride, silicon carbide, tungsten carbide, or combinations thereof, and the second dielectric material may be one or more of boron nitride, aluminum oxide, beryllium oxide, hafnium oxide, silicon dioxide, yttrium oxide, or combinations thereof. However, as discussed above, it should be clear that, in embodiments, other dielectric materials may be utilized. Nonetheless, in embodiments, the base dielectric material is aluminum nitride and the second dielectric material is boron nitride. Additionally or alternatively, in embodiments, the boron nitride may be a polycrystalline boron nitride, a pyrolytic boron nitride, amorphous boron nitride, stack of multiple boron nitride sheets (turbostratic boron nitride), or a combination thereof. Moreover, it should be understood that, in embodiments, the base dielectric material may include one or more dielectric materials, and/or the second dielectric material may include one or more dielectric materials.

For example, in some embodiments, the chuck body 325, the stem 330, and/or the support surface 327 may be formed from one or more composite ceramic materials as discussed herein, and the composite ceramic material may exhibit a volumetric resistivity greater than or about $1 \times 10^8$ ohm-cm, such as greater than or about $5 \times 10^8$ ohm-cm, such as greater than or about $1 \times 10^9$ ohm-cm, greater than or about $5 \times 10^9$ ohm-cm, greater than or about $1 \times 10^{10}$ ohm-cm, greater than or about $3 \times 10^{10}$ ohm-cm, greater than or about $5 \times 10^{10}$ ohm-cm, greater than or about $7 \times 10^{10}$ ohm-cm, greater than or about $1 \times 10^{11}$ ohm-cm, greater than or about $3 \times 10^{11}$ ohm-cm, greater than or about $5 \times 10^{11}$ ohm-cm, greater than or about $7 \times 10^{11}$ ohm-cm, or such as less than or about $1 \times 10^{12}$ ohm-cm, or any ranges or values therebetween, at any of the discussed temperatures or ranges thereof discussed herein.

Nonetheless, the present technology has surprisingly found that the effects of the composite ceramic material may be exhibited or further improved due to a generally even or homogenous distribution of the second dielectric material in the base material. For instance, as illustrated in FIG. 3, grains or particles (or the like) of second dielectric material 304 may be evenly distributed throughout grains or particles (or the like) of base dielectric material 302. Without wishing to be bound by theory, it is believed that such an even distribution may form or further improve the increased electrical conduction path and resistivity discussed above. Namely, it is believed that such even distribution may allow for extended paths and resistivities to be exhibited across an entirety of the substrate support surface 327, allowing improvements in chucking pressures and arcing. In embodiments, the final microstructure of the substrate support surface 327 may contain one or more additional dielectric materials 303 (e.g., one or more dielectric materials 303 other than the base and second dielectric material). The one or more additional dielectric material 303 may be formed during the thermal processing such as hot pressing for sintering, as an example.

Thus, in embodiments, the composite ceramic material has a second dielectric material concentration at any given distance from the substrate support surface 327 toward the electrode 335 and/or at any given point or region along the substrate support surface 327 or electrostatic chuck body 325 that is greater than or about 50% of an average second dielectric material concentration, such as greater than or about 60%, such as greater than or about 70%, such as greater than or about 80%, such as greater than or about 85%, such as greater than or about 90%, such as greater than or about 92.5%, such as greater than or about 95%, such as greater than or about 97.5%, such as greater than or about 99%, such as greater than or about 99.5% of the average second dielectric material concentration. In addition, the above values may be based upon an average volume of the second dielectric material, an average percentage by weight, or both an average by volume and an average by weight, of the second dielectric material, where the average is an average based upon the total weight or total volume of the second dielectric material in the composite ceramic material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include one or more metal, ceramic, or composite heating elements embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking electrode 335, which may be a mesh electrode, may be positioned between the heater 350 and the substrate support surface 327 in some embodiments, and a distance may be maintained between the electrode within the chuck body and the substrate support surface in some embodiments as will be described further below.

In some embodiments, the dielectric material surrounding the heater 350 (e.g. an internal portion of chuck body 325) may only contain the base dielectric ceramic material while the dielectric material surrounding the chucking electrode 335 (e.g. a portion adjacent to support surface 327, surrounding chucking electrode 335, and/or between chucking electrode 335 and support surface 327) includes the composite ceramic material. In some embodiments, the base dielectric material surrounding the heater 350 may have a different composition than the base dielectric composition of the composite ceramic material surrounding the chucking electrode 335. In some embodiments, the composite ceramic material may only be utilized on top of the chucking electrode 335, such as extending from an upper surface of chucking electrode 335 to support surface 327.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C. above or about 550° C., above or about 600° C., above or about 650° C., above or about 700° C. above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, as will be described further below, the chuck heater may be operated to maintain a substrate temperature above at least 500° C. during deposition operations, such as forming stacks of material for memory devices as previously described.

FIG. 4 shows a schematic partial cross-sectional view of an exemplary substrate support assembly 400 according to some embodiments of the present technology. Substrate support assembly 400 may include any of the materials or components previously described, and may illustrate additional details of substrate support assemblies previously discussed. As illustrated, an electrostatic chuck body 405 may include an embedded electrode 410 and an embedded heater 415 as previously described. A substrate support surface 406 may be defined by the chuck body and may be configured to support a semiconductor substrate 430. The substrate support surface may define a recessed pocket 408 within the substrate support surface. A recessed ledge 420 may be defined in the substrate support surface as well. The recessed ledge may extend radially inward from an outer radial edge of the recessed pocket. Additionally, the substrate support surface may define a number of protrusions 425 extending from the substrate support surface within the recessed pocket 408. An exposed surface across the protrusions 425 may define contact locations where substrate 430 may contact the substrate support surface. However, in embodiments, no recessed pocket 408, ledge 420, and/or protrusions 425 may be present, and the substrate support surface 406 may be generally horizontal, such as less than or about 10 degrees, such as less than or about 7.5 degrees, such as less than or about 5 degrees, such as less than or about 2.5 degrees, such as less than or about 1 degree from horizontal and/or planar across all or a portion of the substrate support surface 406.

As described above, a power supply may be provided for each of the heater 415 and the electrode 410 in embodiments, which may be any number of power supplies. For example, the power supply for the electrode may be a DC power supply, or any other power supply, and may provide a voltage range configured to chuck a substrate to the substrate support surface 406. For example, a relatively higher power supply may be used for systems according to some embodiments of the present technology to facilitate chucking substrates having thicker deposition layers and/or depositions occurring at higher temperatures. As one non-limiting example, as the deposition temperature increases, the resistivity of standard ceramic materials may decrease, challenging the capability to properly chuck the substrate to the support assembly.

To compensate for these forces, an increased chucking voltage may be used to maintain a substantially planar substrate surface (e.g., generally coplanar with substrate support surface 406 or a portion thereof within the ranges discussed above), although an amount of bowing may still occur. As the temperature of the deposition and/or the substrate thickness increase, the minimum voltage to maintain chucking may continue to increase. Consequently, in some monopolar embodiments a minimum chucking voltage may be above or about −200 V, and depending on the stress, the minimum chucking voltage may be greater than or about −300 V, greater than or about −400 V, greater than or about −500 V, greater than or about −600 V, greater than or about −700 V, greater than or about −800 V, greater than or about −900 V, greater than or about −1000 V, greater than or about −1100 V, greater than or about −1200 V, greater than or about −1300 V, greater than or about −1400 V, greater than or about −1500 V, or more, or any ranges or values therebetween. In some bipolar embodiments a minimum chucking voltage may be above or about +/−200 V. and depending on the stress, the minimum chucking voltage may be greater than or about +/−300 V, greater than or about +/−400 V, greater than or about +/−500 V, greater than or about +/−600 V, greater than or about +/−700 V, greater than or about +/−800 V, greater than or about +/−900 V, greater than or about +/−1000 V, greater than or about +/−1100 V, greater than or about +/−1200 V, greater than or about +/−1300 V, greater than or about +/−1400 V, greater than or about +/−1500 V, or more As noted above, however, these deposition operations may be performed at increased temperatures, which may directly impact the resistivity of the chuck body material, and the ability of this material to operate appropriately as a J-R chuck. For example, electrostatic chuck body 405 may be aluminum nitride, for example, which may be characterized by a bulk resistance at a certain temperature. As the temperature of the material increases, resistance drops, and may drop significantly at temperatures above 500° C., for example. As the resistance drops, a likelihood of electrostatic discharge or arcing may increase. Additionally, to limit the substantial bowing of a substrate that may otherwise occur during these depositions, increased voltage may be used to maintain chucking. However, as this voltage is increased, the likelihood of arcing may similarly increase, which may limit the amount of voltage that may be applied for chucking, and which may limit the ability to counteract bowing. This has conventionally led to damage and reduced quality of production.

However, the present technology utilizes materials and configurations that may facilitate higher clamping pressures at lower voltages. For example, conventional technology may exhibit arcing at clamping voltages above or about 1500 V, or about 2000 V, as the resistivity drops at temperatures of greater than 600° C., resulting in dropping clamping pressure even at increasing voltages. This clamping pressure may be insufficient to compensate for the temperature dependency of traditional ceramic materials at high temperatures. Namely, as known in the art, traditional ceramics, such as aluminum nitride, exhibit decreases in electrical resistivity of less than $1 \times 10^8$ at temperatures of greater than 600° C., making clamping pressures of greater than 1000 Torr at such high temperatures unobtainable. Surprisingly the present technology may facilitate chucking at voltages of between about 500 V to about 1500 V, and including between about 750 V to about 1250 V, which may accommodate higher clamping pressures, such as greater than 150 Torr, due to the excellent resistivity of the ceramic materials discussed herein.

Namely, for J-R chucking, chucking force generally increases to a saturation level as temperature increases due to the resistance changes within the pedestal material facilitating charge migration to the surface of the chuck body, such as protrusions 425 that may directly contact the substrate or a generally planar substrate contact surface 406. However, this has conventionally led to arcing about the substrate when chucking voltage is increased to levels to accommodate increased substrate bowing. The present technology improves on these deficiencies providing assemblies that may operate at increased processing temperatures to compensate for decreases in resistivity exhibited in traditional substrate support assemblies.

Leakage current is an indicator of migration within a substrate support material, which may be measured from leakage occurring from the electrode to the substrate. Conventional technologies may accept leakage currents of greater than or about 10 mA at particular operating temperatures, which may increase dramatically at operating temperatures above 500° C. While conventional technologies may consider leakage current from a perspective of insulation layer damage or substrate damage, relatively high leakage currents may be accepted in an attempt to boost chucking force. However, this has led to increased arcing in conventional designs. The present technology modifies aspects and characteristics of the substrate support assembly to limit leakage current by effectively increasing resistivity of the substrate support materials to limit leakage current while maintaining chucking force at the substrate. Accordingly, the present technology produces substrate support assemblies characterized by a resistivity that is maintained within a range to adequately chuck a substrate characterized by stresses as previously described, while also limiting or preventing arcing at high temperatures.

The present technology may limit leakage current and/or decreases in electrical resistivity of the composite ceramic material at temperatures greater than or about 600° C., such as greater than or about 625° C. greater than or about 650° C., greater than or about 675° C. greater than or about 700° C. greater than or about 725° C., greater than or about 750° C. greater than or about 775° C., greater than or about 800° C., greater than or about 825° C. greater than or about 850° C., greater than or about 875° C., greater than or about 900°

C., or higher, such as up to about 1200° C. or higher, or any ranges or values therebetween.

The present technology may also limit leakage current, limit decreases in electrical resistivity of the composite ceramic material, and provide excellent chucking pressures at lower chucking voltages, such as chucking voltages of greater than or about 500 V, and may limit leakage current and provide excellent chucking pressures at chucking voltages of greater than or about 600 V, greater than or about 700 V, greater than or about 800 V, greater than or about 900 V, greater than or about 1000 V, greater than or about 1100 V, greater than or about 1200 V, greater than or about 1300 V, or such as less than or about 2000 V, less than or about 1900 V, less than or about 1800 V, less than or about 1700 V, less than or about 1600 V, less than or about 1500 V, less than or about 1400 V, or any ranges or values therebetween, at high temperatures discussed herein.

The present technology may limit leakage current within these temperature and voltage ranges to less than or about 20 mA, and may limit leakage current to less than or about 15 mA, less than or about 10 mA, less than or about 8 mA, less than or about 6 mA, less than or about 5 mA, less than or about 4 mA, less than or about 3.5 mA, less than or about 3 mA, less than or about 2.5 mA, less than or about 2 mA, less than or about 1.5 mA, or less. However, in some embodiments the leakage current may be maintained greater than or about 0.2 mA to ensure adequate migration to facilitate J-R chucking, and in some embodiments may maintain leakage currents greater than or about 0.3 mA, greater than or about 0.5 mA, greater than or about 0.7 mA, greater than or about 1.0 mA, or higher.

As noted above, J-R chucking may be at least partially based on a resistance of a contact layer provided between the substrate and the pedestal. By adjusting the resistivity of the contact layer utilizing one or more of the composite ceramic materials discussed above, excellent chucking pressure is exhibited at high temperatures. In addition, in embodiments, such excellent chucking pressure is exhibited even without requiring high chucking voltages or increased distances between the electrode and the substrate support surface. Namely, as noted above surprisingly, by forming a composite ceramic material according to the present technology, the conduction path and resistivity can be increased without increasing the amount or thickness of ceramic material.

Based on the increased temperatures of some embodiments of the present technology, the chucking force may be substantially maintained or minimally lowered. For instance, the present technology may provide a clamping pressures of greater than 50 Torr, such as greater than or about 60 Torr, such as greater than or about 70 Torr, such as greater than or about 80 Torr, such as greater than or about 90 Torr, such as greater than or about 100 Torr, such as greater than or about 120 Torr, such as greater than or about 140 Torr, such as greater than or about 160 Torr, such as greater than or about 200 Torr, or any ranges or values therebetween and at any one or more of the above temperature ranges (e.g. greater than or about 600° C.). In addition, as may be understood by one having skill in the art, such pressures may be an absolute value of pressure, and may therefore also reference negative pressures.

FIG. 5 shows exemplary operations in a processing method 500 according to some embodiments of the present technology. The method may be performed with a variety of processing chambers and on one or more mainframes or tools, including processing chambers 100 and/or 200 described above. Method 500 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 500 may describe operations shown schematically in any one or more of the preceding figures. It is to be understood that the figures illustrate only partial schematic views, and a method 500 may contain any number of additional materials and operations having a variety of characteristics and aspects as shown in the figures.

For instance, in embodiments, an operation 502 includes combining the base dielectric material with a second dielectric material, or with one or more forming precursors for the synthesis of a second dielectric material composition (also referred to as a dielectric material powder in embodiments). In embodiments, the base dielectric material and the second dielectric material may be combined utilizing any method as known in the art. Moreover, as noted above, it should be clear that, in embodiments, more than two dielectric materials may be combined so long as a dielectric material having a higher resistivity as discussed above is included.

Nonetheless, as discussed above, in embodiments, it may be desirable to combine the base dielectric material with the second dielectric material, or with the one or more forming material precursors such that the second dielectric material is relatively evenly or homogenously formed and distributed throughout the composite ceramic material. In embodiments, operation 502 may therefore include combining grains and/or particles of a base dielectric material with particles of the second dielectric material. As an example only, the base dielectric material may include aluminum nitride and the second dielectric material may include boron nitride.

However, as known in the art, materials having different structural, mechanical, and/or surface properties exhibit a strong tendency to agglomerate when mixed, thus rendering even or homogenous distribution of particles unfeasible, in embodiments. Thus, in embodiments where it is desired to start with particles of the second dielectric material, the particles may be exfoliated into the structural building blocks or sheets of the second dielectric material. Exfoliation may include physical exfoliation, such as milling, including wet ball milling, alone or in combination with sonication, as well as chemical exfoliation utilizing chemical exfoliation agents. Chemical exfoliants may include ammonia, methanesulfonic acid, combinations thereof, or other exfoliating agents as known in the art. In embodiments, both chemical and physical exfoliation may be utilized. Nonetheless, in embodiments, particles or sheets, such as nanosheets of the second dielectric material may be formed. In an example, particles or sheets may include boron nitride layers exfoliated from polycrystalline boron nitride.

Additionally or alternatively, it may be desirable to mix one or more forming material precursors of the second dielectric material into a base dielectric composition. As an example only, when boron nitride is desired as the second dielectric material, suitable boron containing precursors include boric acid, diborane, triborane, tetraborane, decaborane, trimethylborane, tricthylborane, trifluoroborane, trichloroborane, adducts thereof, or any combination thereof, as well as other boron containing precursors as known in the art.

In embodiments, a second forming precursor of the second dielectric material may be mixed with the base dielectric material in order to form the second dielectric material. For instance, in exemplary embodiments, a nitrogen containing precursor, when the second dielectric material is boron nitride, may be mixed with the base dielectric particles and the first forming material precursor. Suitable nitrogen containing precursors include liquid ammonia, urea, nitrogen ions, any combination thereof, or other nitrogen containing precursors as known in the art.

However, it should be understood that, in embodiments, the second dielectric material may be formed by reducing the forming material precursor following by compounding at operation 504. The operation is shown as optional for embodiments where the method 500 begins with a second dielectric material, but may be utilized when precursors are present. Nonetheless, in such embodiments, a second precursor material, such as nitrogen, may instead be introduced as a forming gas during operation 504. In embodiments, the forming gas can include ammonia, nitrogen, combinations thereof, as well as other nitrogen containing forming gasses as known in the art. The forming gas may be mixed with a reducing gas such as hydrogen, or any hydrocarbon species, or any combination thereof, or any other suitable reducing agents as known in the art. The reduction and compounding processes at operation 504 may be driven by a thermal treatment, heating by electromagnetic waves such as RF or microwave sources, any combination thereof, or any other energy sources as known in the art.

Regardless of the method in which nitrogen (or any second precursor material) is introduced, it may also be desirable to include a carbon containing precursor during operation 502. Carbon containing precursors may include graphite, divinylbenzene, polymer resins, combinations thereof, or other carbon containing precursors as known in the art. Namely, in embodiments, carbon may be utilized to minimize oxygen present in the base dielectric material or introduced into the base dielectric material during operation 502 and/or 504. Namely, the inclusion of carbon may reduce some or all oxides of the base dielectric material, such as oxidized aluminum nitride, present.

Although, in embodiments, it is desirable to retain some oxide present in the dielectric material composition formed at operation 502 and/or 504 in order to provide oxygen for a sintering operation 506. Namely, oxygen may facilitate the liquid phase formation necessary for sintering. However, oxygen levels, such as high oxygen levels, may also affect the resistivity of the composite ceramic material. Thus, in embodiments, the dielectric material composition, prior to adding any oxide materials as sintering aids, and prior to sintering operation 506, such as immediately prior to operation 506 in embodiments, may contain greater than 0.001 wt. % oxygen, such as greater than or about 0.01 wt. %, such as greater than or about 0.1 wt. %, such as greater than or about 0.2 wt. %, such as greater than or about 0.3 wt. %, such as greater than or about 0.4 wt. %, such as greater than or about 0.5 wt. %, such as greater than or about 0.6 wt. %, such as greater than or about 0.7 wt. %, such as greater than or about 0.8 wt. %, such as greater than or about 0.9 wt. %, such as greater than or about 1 wt. %, such as greater than or about 1.1 wt. %, such as greater than or about 1.2 wt. %, such as greater than or about 1.3 wt. %, such as greater than or about 1.4 wt. %, such as greater than or about 1.5 wt. %, such as greater than or about 1.6 wt. %, such as greater than or about 1.7 wt. %, such as greater than or about 1.8 wt. %, such as greater than or about 1.9 wt. %, such as up to about 2 wt. %, or any ranges or values therebetween, based upon the weight of the dielectric material composition.

Notwithstanding whether a carbon containing precursor is utilized, or whether a nitrogen containing precursor is included, the base dielectric material composition and the other precursors may be added into a liquid composition (e.g., a solvent) media in order to form a stable suspension. Without wishing to be bound by theory, it is believed that such a suspension allows for the one or more second dielectric material forming precursors to dissolve in solution. Thus, upon wet blending and drying, the one or more second dielectric material forming precursors re-crystallize on the surface of the base dielectric material particles present in solution. Due to the one or more precursors dissolving and re-crystallizing, a highly evenly distributed solution (powder upon drying) may be obtained of base dielectric material particles with recrystallized precursor materials formed thereon.

In embodiments, the solution may be a suspension, and regardless may include particles or grains of the base dielectric material, one or more precursor material(s), and, optionally, a dispersing agent. The components may be combined as a solution and blended with the base dielectric material until a relatively uniform suspension is formed. In embodiments, the blending may include wet milling or other blending tools, include ball mills, for example. Suitable solutions for wet blending include water, alcohols, such as ethanol, methanol, isopropyl alcohol, combinations thereof, or other solutions as known in the art.

It may be desirable to include a dispersing agent, in embodiments, in order to maintain the even distribution of precursor materials solution in order to provide even recrystallization of the precursor materials on surfaces of the base dielectric material particles. Thus, in embodiments, suitable dispersing agents include triethylene glycol, polyethyleneimine, other dispersing agents as known in the art, or combinations thereof.

After formation of the suspension, the second dielectric material may be generally uniformly dispersed around the base dielectric particles. Thus, the liquids may be removed from the solution, such as in a low-pressure thermal treatment process. Examples of such process equipment include spray dryers and rotary evaporators, although other processes and apparatus can be utilized as known in the art. Nonetheless, removal of the liquids may result in a dried powder mixture of the first dielectric material and the second dielectric material.

The dried powder mixture may then be utilized to form a composite powder. Namely, the dried powder mixture may be subjected to a thermal treatment process, heating by electromagnetic waves, such as RF or microwave sources, any combination thereof, or by utilizing any other energy sources as known in the art, in the presence of one or more reducing gasses, forming gasses, inert gasses, or combinations thereof. While any reducing gasses, forming gasses, inert gasses, or combinations thereof may be utilized as discussed above, a reducing gas, alone or in combination with an inert gas, and optionally a forming gas, may be introduced to the dried powder mixture at operation 504, forming the second dielectric material, such as boron nitride as an example. Moreover, as discussed above, the second dielectric material forming precursor may be present in recrystallized form on particles of the base dielectric material. Thus, reduction in the presence of a forming precursor or a forming gas may result in forming a composite powder having the second dielectric material relatively evenly dispersed throughout the base dielectric material. Suitable reducing gasses for operation 504 may include hydrogen, hydrocarbons, including methane, combinations thereof, or other reducing gasses as known in the art. Inert gasses may include helium, argon, any other inert gas, or combinations thereof as known in the art.

While any sources of energy, such as thermal or electromagnetic sources may be utilized for the composite powder formation and any process conditions as known in the art may be utilized, in embodiments, the composite powder synthesis may occur in a one-step or two-step thermal treatment process at temperatures of greater than or about 600° C., such as greater than or about 650° C., such as greater than or about 700° C., such as greater than or about 750° C., such as greater than or about 800° C., such as greater than or about 850° C., such as greater than or about 900° C., such as greater than or about 950° C., such as greater than or about 1000° C., such as greater than or about 1050° C., such as greater than or about 1100° C., such as greater than or about 1150° C., such as greater than or about 1200° C., such as greater than or about 1250° C., such as greater than or about 1300° C., such as greater than or about 1350° C., such as greater than or about 1400° C., such as greater than or about 1450° C., such as greater than or about 1500° C., such as greater than or about 1550° C., such as greater than or about 1600° C., such as greater than or about 1650° C., such as up to about 1700° C., or any ranges or values therebetween. Namely, in embodiments, the temperature may be selected to achieve a high degree of crystallinity in the second dielectric material without unduly coarsening the base dielectric material particles or grains, such as aluminum nitride grains in examples, which would result in a decrease in resistivity.

However, in embodiments, it may be desirable to form a composite powder mixture by adding a second dielectric material to the base dielectric material utilizing deposition processes, such as powder coating techniques. For instance, in embodiments, chemical vapor deposition, plasma assisted chemical vapor deposition, atomic layer deposition, plasma assisted atomic layer deposition, or the like, may be utilized to coat grains of the base dielectric material with the second dielectric material. In such embodiments, layers of the second dielectric material, such as pyrolytic boron nitride in this example, may be coated (e.g., powder coated) onto particles of the base dielectric material, such as aluminum nitride.

In embodiments, the process may be considered to be a partial powder coating, in that less than 100% of an exterior surface of the base dielectric material is coated with the second dielectric material, such as less than or about 95%, such as less than or about 90%, such as less than or about 85%, such as less than or about 80%, such as less than or about 75%, such as less than or about 70%, such as less than or about 65%, such as less than or about 60%, such as less than or about 55%, such as less than or about 50%, such as less than or about 45%, such as less than or about 40%, such as less than or about 35%, such as less than or about 30%, such as less than or about 25%, such as less than or about 20%, such as greater than or about 1%, such as greater than or about 5%, such as greater than or about 10%, or any ranges or values therebetween. However, in embodiments, all, or substantially all of a surface of one or more base dielectric particles may be coated with the second dielectric material.

Regardless of the surface coverage, in embodiments, the coating of the second dielectric material may be deposited at a thickness of greater than or about 2 nm, such as greater than or about 5 nm, such as greater than or about 10 nm, such as greater than or about 15 nm, such as greater than or about 20 nm, such as greater than or about 25 nm, such as greater than or about 50 nm, such as greater than or about 100 nm, such as greater than or about 150 nm, such as greater than or about 200 nm, such as greater than or about 250 nm, such as greater than or about 300 nm, such as greater than or about 350 nm, such as greater than or about 400 nm, such as greater than or about 450 nm, such as up to about 500 nm, or any ranges or values therebetween.

While any processing conditions may be utilized as known in the art, in embodiments, the deposition may occur at a temperature of greater than or about 150° C., such as greater than or about 200° C., such as greater than or about 250° C., such as greater than or about 300° C., such as greater than or about 350° C., such as greater than or about 400° C., such as greater than or about 450° C., such as greater than or about 500° C., such as greater than or about 550° C., such as greater than or about 600° C., such as greater than or about 650° C., such as greater than or about 700° C., such as greater than or about 750° C., such as greater than or about 800° C., such as greater than or about 850° C., such as greater than or about 900° C., such as greater than or about 950° C., such as greater than or about 1000° C., such as greater than or about 1050° C., such as greater than or about 1100° C., such as greater than or about 1150° C., such as greater than or about 1200° C., such as greater than or about 1250° C., such as up to about 1300° C., or any ranges or values therebetween.

Notwithstanding the method(s) utilized to form the composite powder mixture, the composite powder mixture may now be utilized to form all or a portion of an electrostatic chuck, such as electrostatic chuck 325 at operation 506, that exhibits any one or more of the excellent electrical properties discussed above. After embedding the chucking electrode 335 and the heater 350, the composite powder mixture may be sintered by any methods as known in the art. In embodiments, the composite powder mixture may be subjected to hot pressing of the composite powder, cold isostatic pressing or gel casting of the composite powder into green plates followed by plate stacking and hot pressing, or sintering of the laminated green sheets formed by tape casting of the composite powder, forming an electrostatic chuck, or portion thereof, as discussed herein.

For instance, hot pressing may include pressing of the composite powder at temperatures of greater than or about 1400° C., such as greater than or about 1450° C., such as greater than or about 1500° C., such as greater than or about 1550° C., such as greater than or about 1600° C., such as greater than or about 1650° C., such as greater than or about 1700° C., such as greater than or about 1750° C., such as greater than or about 1800° C., such as greater than or about 1850° C., such as up to about 1900° C., or any ranges or values therebetween.

Moreover, cold isostatic pressing may include filling a mold with the composite powder and pressing the composite powder to form a green compact. Subsequently, after debinding the green body and embedding the chucking electrode 335 and the heater 350, the resulting body may be hot pressed at any of the temperatures discussed above, or as otherwise known in the art.

In addition, green sheets may be formed by tape casting the composite powder material. The tape casted material may then be stacked and laminated. The laminated material may then be subjected to a debinding process. Subsequently, after embedding the chucking electrode 335 and the heater 350, the laminated material may be pressure-less sintered at any of the temperatures discussed above, or as otherwise known in the art. The pressure-less sintered body can optionally be further treated by hot isostatic pressing for full densification.

In embodiments, it may also be useful to include one or more sintering aids to facilitate even sintering of the composite powder material. Suitable sintering aides include rare-earth metal oxides, such as yttrium oxide and lanthanum oxide, alkaline-earth metal oxides, such as magnesium oxide and calcium oxide, titanium family metal oxides, such as titanium oxide and zirconium oxide, combinations thereof, or other sintering aids as known in the art. In embodiments, sintering aids may be included in the composition during any portions of operations 502 and/or 504 as discussed above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly comprising:
an electrostatic chuck body defining a substrate support surface;
a support stem coupled with the electrostatic chuck body; and
an electrode embedded within the electrostatic chuck body, wherein the substrate support surface comprises a composite ceramic material, the composite ceramic material comprising a second dielectric material dispersed in a base dielectric material, and the substrate support surface comprises a resistivity of $1\times10^8$ $\Omega$-cm to $1\times10^{11}$ $\Omega$-cm at a temperature of greater than 600° C.

2. The substrate support assembly of claim 1, wherein the substrate support surface comprises a resistivity of $1\times10^8$ $\Omega$-cm to $1\times10^{11}$ $\Omega$-cm at a temperature of greater than 650° C.

3. The substrate support assembly of claim 1, further comprising a heater embedded in the chuck body.

4. A substrate support assembly comprising:

an electrostatic chuck body defining a substrate support surface;

a support stem coupled with the electrostatic chuck body; and an electrode embedded within the electrostatic chuck body;

wherein the substrate support surface comprises a composite ceramic material, the composite ceramic material comprising a base dielectric material dispersed in a second dielectric material, wherein the second dielectric material comprises an electrical resistivity at least about two times higher than an electrical resistivity of the base dielectric material at a temperature of greater than 600° C.

5. The substrate support assembly of claim 4, wherein the composite ceramic material has a second dielectric material concentration at any given point along the substrate support or portion thereof that is greater than or about 50% of an average second dielectric material concentration.

6. The substrate support assembly of claim 4, wherein the base dielectric material comprises aluminum nitride and/or the second dielectric material comprises boron nitride.

7. The substrate support assembly of claim 6, wherein the boron nitride is polycrystalline boron nitride, pyrolytic boron nitride, amorphous boron nitride, stack of multiple sheets of boron nitride, or a combination thereof.

8. The substrate support assembly of claim 4, wherein the second dielectric material is present in the composite ceramic material in an amount of about 0.1 wt. % to about 30 wt. %, based upon the weight of the base dielectric material and the second dielectric material.

* * * * *